FIELD-EFFECT NEGATIVE RESISTOR

Filed March 30, 1962

INVENTOR
James F. Gibbons

BY Stowell & Stowell

ATTORNEYS

United States Patent Office 3,255,360

Patented June 7, 1966

3,255,360

FIELD-EFFECT NEGATIVE RESISTOR

James F. Gibbons, Palo Alto, Calif., assignor to Research Corporation, New York, N.Y., a corporation of New York Filed Mar. 30, 1962, Ser. No. 183,922
2 Claims. (Cl. 307—88.5)

The invention relates to two-terminal negative resistance devices and, more particularly, is directed to majority-carrier field-effect devices utilizing space-charge widening for generating a two-terminal negative resistance element. One of the more essential features of the invention is that it is constructed of a P-N junction with doping levels which cause the majority carrier mobilities to be substantially the same in both layers.

The invention seeks to provide a device making use of P and N regions which are of appropriate thicknesses and resistivities and having the voltage drop along each of the regions made substantially equal, so that there is provided a junction that has substantially the same voltage drop across it throughout. The widths of the regions are not necessarily equal to each other.

An object of the invention is to provide a semiconductor resistance device having a characteristic similar to that of a tunnel diode having a much wider dynamic range than a tunnel diode with more usable voltages and current levels.

Another object of the invention is to provide a device for use as an element in an L-C oscillator or other circuit working with a tunnel diode in the higher frequency ranges.

Another object of the invention is to provide an element for use in a relaxation oscillator circuit for producing a range of wave forms from a sine wave to a square wave with frequencies extending within the range of 1 kmc.

Prior art devices are known having a P-N junction to which up to four connections are made and are known not to include the characteristic of equal mobilities of the holes and electrons of the respective regions. Other devices are formed of equal doping levels of the P and N type layers. Such devices do not have extended and continuous negative resistance regions. Some of these devices are constructed to equate the doping effects of the channels formed of the P and N regions. The disadvantages of such devices are that they produce results that are not found satisfactory, since there are different carrier mobilities in each channel at the same time and there is modulated conductance of each channel along its length by voltage conditions in the other.

Thus, another object of the present invention is to produce a field-effect negative resistance device with an appreciable dynamic range of negative resistance in which the channels in the layers of a semiconductive device are connected in series with distal ends mutually connected together.

Other objects and advantages will be apparent from a detailed description of the invention and from the appended drawings and claims.

Figure 1:
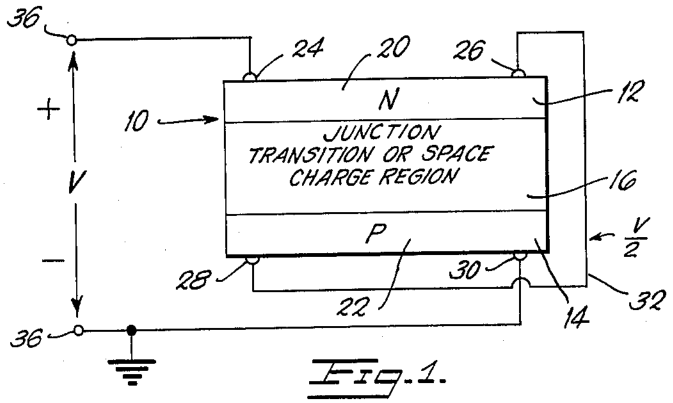
FIG. 1 shows a schematic diagram of a negative resistance semiconductor device embodying the present invention.

Referring now to the drawings, FIG. 1 shows a semiconductor 10 which is a field-effect device formed of a material of thin, heavily doped N-type region 12 which in turn is formed on a relatively thicker, lightly doped P-type region 14. The adding of impurities to substantially pure semiconductor material is known as doping. The doping levels of the material forming the regions 12, 14 are achieved by deposition of a vapor on a semiconductor body, or by epitaxial growth techniques known in the art of making semiconductor devices. The regions 12, 14 each form layers that are juxtaposed forming a junction 16. The thickness of the P and N type layers forming the regions 12, 14 are determined by the doping levels or densities, which are made different, so that there are formed two conducting channels 20, 22 disposed along the length of the layers; such that said channels exhibit equal lateral end-to-end resistances. The amount of doping, the thicknesses of the layers, the material forming the regions 12, 14, the temperature at which the device operates and the other necessary parameters are controlled so that majority carrier mobilities of the layers are the same when a voltage is applied along the length of the channel.

Conducting channel 20 is independently terminated at terminals 24 and 26, and channel 22 is independently terminated at terminals 28 and 30.

The device makes use of the fact that if the P and N regions are of appropriate thicknesses and resistivities, the voltage falls along both regions 20 and 22 at the same rate, and, since terminal 26 is connected to distal terminal 28, the voltage difference across junction 16 between the regions 20 and 22 is the same at all points along the junction 16 and its associated space charge region. Since junction 16 is reverse-biased by the applied voltage V, any current flow across it will be leakage current. This is extremely small compared to the main current flow along channel regions 20 and 22 and thus can be neglected.

Figure 2:
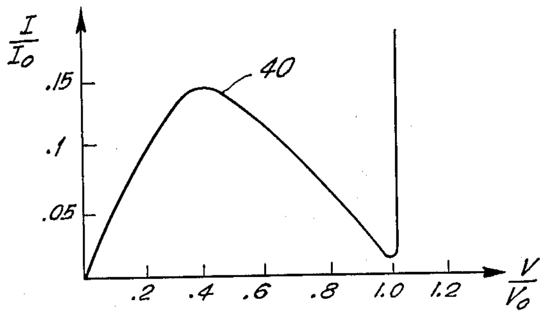
FIG. 2 shows a graph of the normalized V-I characteristic of the device of FIG. 1.

As the applied voltage V is increased, the space charge region of the junction 16 widens, thereby decreasing the width and hence increasing the end-to-end resistance of channels 20 and 22 in the N and P regions 12, 14. With further rises in the applied voltage a point is reached where the resistance of channels 20, 22 increases at a relatively more rapid rate than the voltage increases. This causes a decrease in the current through channels 20, 22 although the applied voltage is increasing, and thus produces a negative resistance effect. The negative portion of the V-I curve shown in FIG. 2 illustrates this characteristic of the device.

If sufficient reverse voltage is applied, the space charge region penetrates almost the entire structure and reduces the conductance of channels 20, 22 to practically zero. A further increase in the applied voltage causes the space charge region to touch the contacts 24, 26, 28, 30 with a resultant abrupt rise in current, as shown in FIG. 2.

In an optimum design, the applied voltage V at which the current increases abruptly can be made equal to the avalanche voltage of the P-N junction. The end-to-end resistances and the majority carrier mobilities in channels 20 and 22 are made equal to each other, and thus the voltage of conductor 32 is always half the applied voltage at terminals 24 and 30 throughout the operating range of the device.

The operation of the device is based entirely on majority carrier effects and is relatively insensitive to environmental conditions. Calculated switching times are in the range of 1 nanosecond for appropriate geometry, and frequency response is of the order of 1 kilomegacycle.

The device utilizes widening of a space charge region to generate a two-terminal negative resistance, and has many applications as a power oscillator, amplifier, and the like, since there is an appreciable dynamic range in the negative resistance characteristics of the device.

Figure 3:
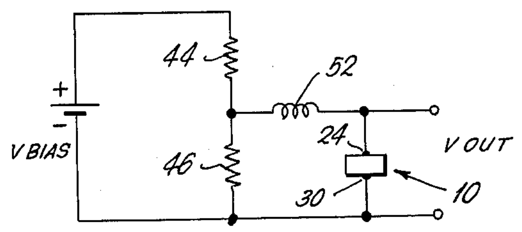
FIG. 3 shows a circuit diagram of a negative resistance relaxation oscillator embodying the present invention.
Figure 4:
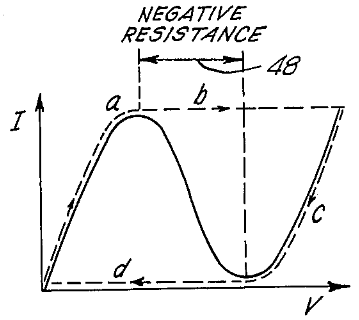
FIG. 4 shows a graph of the manner in which the circuit of FIG. 3 contemplates the use of the characteristics of the graph of FIG. 2.

FIG. 3 shows a negative resistance relaxation oscillator circuit in which resistances 44, 46 are arranged to provide a D.C. bias for the semiconductor device 10 in the negative resistance region 48 of the characteristics shown in FIG. 4. The device 10 is a two terminal negative resistance element of the type shown in FIG. 1. The P and N conductivity regions follow the same back biasing arrangement with respect to the polarity of the biasing battery source V as has been fully illustrated and described in connection with FIG. 1. Thus FIG. 3 shows a positive polarity voltage applied to the N region terminal 24 and a negative polarity connection to the P region terminal 30. The inductance 52 in series with the device 10 acts to oppose rapid changes in the current through it. When the voltage V-bias is first applied, the current through the inductance and the device and the output voltage V-out slowly increases as shown by region *a* in FIG. 4. When the negative resistance region *b* is reached, the device 10 requires less current to cause an increase in voltage across it, and, since the inductance 52 tends to maintain the current constant, the output voltage suddenly rises to a high value. The current controlled by the inductance 52 gradually decreases over the region *c* until the region *d* in FIG. 4 is reached. The current is now at a very low value, and, because of the negative resistance characteristic of the device in this region, the voltage V-out across the device suddenly drops from its high value to zero. The whole cycle now repeats as shown by the dotted arrow path of FIG. 4. The actual waveform and frequency thereof is determined by the characteristics of the device and the circuit 44, 46, 52 and can be shaped as a sine-wave or a square wave, or the like, with frequencies to 1 kmc.

The characteristic of the negative resistance device is similar to that of a tunnel diode, but the device of the invention has a much wider dynamic range and operates at a wider range of voltage and current levels. Any L-C oscillator or other circuit which utilizes a tunnel diode as the active element would operate with greater power output using device of the present invention, so long as the frequency of operation is below about 1 kmc. The application of the device herein to a relaxation oscillator is not by way of limitation to such particular circuit, and the device may be utilized for any purpose for which the negative resistance and other characteristics of the device are found desirable. The general theory and use of two-terminal negative resistance oscillators and other circuits are known in the prior art.

A preferred embodiment of the invention has been described. Various changes and modifications, however, may be made within the scope of the invention as set forth in the appended claims.

What is claimed is:

1. A field effect semiconductor device having negative resistance characteristics comprising material forming layers of a doped N region on a doped P region forming a N-P junction, a pair of linearly spaced terminals attached to each of said layers forming a conductive current channel through each of said layers, the terminals of said N layer lying opposite the terminals of said P layer, and means connecting one non-opposite terminal of each of said layers across a source of voltage, means connecting together the other non-opposite terminals of said layers, said layers having equal majority carrier mobilities and equal end-to-end impedances, whereby the device exhibits a negative dynamic resistance characteristic.

2. A field effect semiconductor device according to claim 1 wherein said layers have different doping densities.

References Cited by the Examiner

UNITED STATES PATENTS

| | | | |
|---|---|---|---|
| 2,744,970 | 5/1956 | Shockley | 317—234 |
| 2,869,055 | 1/1959 | Noyce | 317—234 |
| 3,061,739 | 10/1962 | Stone | 317—224 |
| 3,040,188 | 6/1963 | Gaertner et al. | 317—234 |

JAMES D. KALLAM, *Acting Primary Examiner.*

DAVID J. GALVIN, *Examiner.*